United States Patent
Sharma et al.

(10) Patent No.: US 9,228,860 B2
(45) Date of Patent: Jan. 5, 2016

(54) SENSOR AND METHOD OF PROVIDING A SENSOR

(75) Inventors: Nirmal Sharma, Shrewsbury, MA (US); Virgil Ararao, Rutland, MA (US); Leonardo T. Magpantay, Paranaque (PH); Raymond W. Engle, Southbridge, MA (US); William P. Taylor, Amherst, NH (US); Kirsten Doogue, Manchester, NH (US); Jay Gagnon, Holden, MA (US)

(73) Assignee: Allegro Microsystems, LLC, Worcester, MA (US)

( * ) Notice: Subject to any disclaimer, the term of this patent is extended or adjusted under 35 U.S.C. 154(b) by 673 days.

(21) Appl. No.: 13/325,162

(22) Filed: Dec. 14, 2011

(65) Prior Publication Data

US 2012/0086090 A1   Apr. 12, 2012

Related U.S. Application Data

(63) Continuation of application No. 11/457,626, filed on Jul. 14, 2006, now abandoned.

(51) Int. Cl.
| | |
|---|---|
| *H05K 7/10* | (2006.01) |
| *H05K 7/12* | (2006.01) |
| *G01D 11/24* | (2006.01) |
| *G01R 33/07* | (2006.01) |
| *H01L 23/495* | (2006.01) |

(52) U.S. Cl.
CPC .............. *G01D 11/245* (2013.01); *G01R 33/07* (2013.01); *H01L 23/49589* (2013.01); *H01L 2224/48247* (2013.01); *H01L 2924/10253* (2013.01); *H01L 2924/3011* (2013.01)

(58) Field of Classification Search
USPC ................... 361/760–764, 782–784, 803, 813
See application file for complete search history.

(56) References Cited

U.S. PATENT DOCUMENTS

| | | | |
|---|---|---|---|
| 4,409,608 | A | 10/1983 | Yoder |
| 5,244,834 | A | 9/1993 | Suzuki et al. |
| 5,399,905 | A | 3/1995 | Honda et al. |
| 5,414,355 | A | 5/1995 | Davidson et al. |
| 5,434,105 | A | 7/1995 | Liou |
| 5,563,199 | A | 10/1996 | Harada et al. |
| 5,579,194 | A | 11/1996 | Mackenzie et al. |
| 5,581,179 | A | 12/1996 | Engel et al. |

(Continued)

FOREIGN PATENT DOCUMENTS

| | | |
|---|---|---|
| DE | 40 31 560 | 4/1992 |
| DE | 102 31 194 A1 | 2/2004 |

(Continued)

OTHER PUBLICATIONS

Japanese Notice of Reasons for Rejection; dated Jun. 12, 2013; for Japanese Pat. App. No. 2009-519438; 2 pages.
Office Action dated Jan. 17, 2013 for Appl. No. 200780021981.6.
Response to Office Action dated Jan. 17, 2013 as filed on Apr. 1, 2013 for Appl. No. 200780021981.6.

(Continued)

*Primary Examiner* — Tuan T Dinh
(74) *Attorney, Agent, or Firm* — Daly, Crowley Mofford & Durkee, LLP

(57) ABSTRACT

Methods and apparatus for a magnetic field sensor in a molded IC package having a magnetic field sensing element in a die with a component coupled to a leadframe at a downset area. In embodiments, a thickness of the leadframe in the downset area is less than a thickness of the leadframe in a non-downset area adjacent to the downset area.

9 Claims, 15 Drawing Sheets

Section A-A

(56) References Cited

U.S. PATENT DOCUMENTS

| | | | |
|---|---|---|---|
| 5,648,682 A | 7/1997 | Nakazawa et al. |
| 5,666,004 A | 9/1997 | Bhattacharyya et al. |
| 5,691,869 A | 11/1997 | Engel et al. |
| 5,714,405 A | 2/1998 | Tsubosaki et al. |
| 5,726,577 A | 3/1998 | Engel et al. |
| 5,729,130 A | 3/1998 | Moody et al. |
| 5,804,880 A | 9/1998 | Mathew |
| 5,822,849 A | 10/1998 | Casali et al. |
| 5,912,556 A | 6/1999 | Frazee et al. |
| 5,940,256 A | 8/1999 | MacKenzie et al. |
| 5,973,388 A | 10/1999 | Chew et al. |
| 6,057,997 A | 5/2000 | MacKenzie et al. |
| 6,066,890 A | 5/2000 | Tsui et al. |
| 6,265,865 B1 | 7/2001 | Engel et al. |
| 6,316,736 B1 | 11/2001 | Jairazbhoy et al. |
| 6,356,068 B1 | 3/2002 | Steiner et al. |
| 6,359,331 B1 | 3/2002 | Rinehart et al. |
| 6,396,712 B1 | 5/2002 | Kuijk |
| 6,420,779 B1 | 7/2002 | Sharma et al. |
| 6,429,652 B1 | 8/2002 | Allen et al. |
| 6,486,535 B2 | 11/2002 | Liu |
| 6,501,270 B1 | 12/2002 | Opie |
| 6,504,366 B2 | 1/2003 | Bodin et al. |
| 6,563,199 B2 | 5/2003 | Yasunaga et al. |
| 6,608,375 B2 | 8/2003 | Terui et al. |
| 6,610,923 B1 | 8/2003 | Nagashima et al. |
| 6,642,609 B1 | 11/2003 | Minamio et al. |
| 6,696,952 B2 | 2/2004 | Zirbes |
| 6,713,836 B2 | 3/2004 | Liu et al. |
| 6,737,298 B2 | 5/2004 | Shim et al. |
| 6,747,300 B2 | 6/2004 | Nadd et al. |
| 6,770,163 B1 | 8/2004 | Kuah et al. |
| 6,775,140 B2 | 8/2004 | Shim et al. |
| 6,781,233 B2 | 8/2004 | Zverev et al. |
| 6,781,359 B2 | 8/2004 | Stauth et al. |
| 6,798,057 B2 | 9/2004 | Bolkin et al. |
| 6,809,416 B1 | 10/2004 | Sharma |
| 6,812,687 B1 | 11/2004 | Ohtsuka |
| 6,825,067 B2 | 11/2004 | Ararao et al. |
| 6,832,420 B2 | 12/2004 | Liu |
| 6,853,178 B2 | 2/2005 | Hayat-Dawoodi |
| 6,861,283 B2 | 3/2005 | Sharma |
| 6,875,634 B2 | 4/2005 | Shim et al. |
| 6,902,951 B2 | 6/2005 | Goller et al. |
| 6,921,955 B2 | 7/2005 | Goto |
| 6,960,493 B2 | 11/2005 | Ararao et al. |
| 6,974,909 B2 | 12/2005 | Tanaka et al. |
| 6,995,315 B2 | 2/2006 | Sharma et al. |
| 7,005,325 B2 * | 2/2006 | Chow et al. .................. 438/123 |
| 7,026,808 B2 | 4/2006 | Vig et al. |
| 7,031,170 B2 | 4/2006 | Daeche et al. |
| 7,075,287 B1 | 7/2006 | Mangtani et al. |
| 7,166,807 B2 | 1/2007 | Gagnon et al. |
| 7,250,760 B2 | 7/2007 | Ao |
| 7,259,624 B2 | 8/2007 | Barnett |
| 7,265,531 B2 | 9/2007 | Stauth et al. |
| 7,269,992 B2 | 9/2007 | Lamb et al. |
| 7,304,370 B2 | 12/2007 | Imaizumi et al. |
| 7,358,724 B2 | 4/2008 | Taylor et al. |
| 7,378,721 B2 | 5/2008 | Frazee et al. |
| 7,385,394 B2 | 6/2008 | Auburger et al. |
| 7,476,816 B2 | 1/2009 | Doogue et al. |
| 7,476,953 B2 | 1/2009 | Taylor et al. |
| 7,573,112 B2 | 8/2009 | Taylor |
| 7,676,914 B2 | 3/2010 | Taylor |
| 7,687,882 B2 | 3/2010 | Taylor |
| 7,816,772 B2 | 10/2010 | Engel |
| 2001/0052780 A1 | 12/2001 | Hayat-Dawoodi |
| 2002/0027488 A1 | 3/2002 | Hayat-Dawoodi et al. |
| 2002/0195693 A1 | 12/2002 | Liu et al. |
| 2003/0209784 A1 | 11/2003 | Schmitz et al. |
| 2004/0094826 A1 | 5/2004 | Yang et al. |
| 2004/0135220 A1 | 7/2004 | Goto |
| 2004/0135574 A1 | 7/2004 | Hagio |
| 2004/0207035 A1 | 10/2004 | Witcraft et al. |
| 2004/0207077 A1 | 10/2004 | Leal et al. |
| 2004/0207400 A1 | 10/2004 | Witcraft et al. |
| 2004/0262718 A1 | 12/2004 | Ramakrishna |
| 2005/0035448 A1 | 2/2005 | Hsu et al. |
| 2005/0040814 A1 | 2/2005 | Vig et al. |
| 2005/0151448 A1 | 7/2005 | Hikida et al. |
| 2005/0173783 A1 | 8/2005 | Chow et al. |
| 2005/0224248 A1 | 10/2005 | Gagnon et al. |
| 2005/0248005 A1 | 11/2005 | Hayat-Dawoodi |
| 2005/0253507 A1 | 11/2005 | Fujimura et al. |
| 2005/0270748 A1 | 12/2005 | Hsu |
| 2005/0274982 A1 | 12/2005 | Ueda et al. |
| 2006/0077598 A1 | 4/2006 | Taylor et al. |
| 2006/0181263 A1 | 8/2006 | Doogue et al. |
| 2006/0219436 A1 | 10/2006 | Taylor et al. |
| 2006/0267135 A1 | 11/2006 | Wolfgang et al. |
| 2007/0007631 A1 | 1/2007 | Knittl |
| 2007/0018642 A1 | 1/2007 | Ao |
| 2007/0138651 A1 | 6/2007 | Hauenstein |
| 2007/0170533 A1 | 7/2007 | Doogue et al. |
| 2008/0013298 A1 | 1/2008 | Sharma et al. |
| 2011/0133732 A1 | 6/2011 | Sauber |

FOREIGN PATENT DOCUMENTS

| | | |
|---|---|---|
| DE | 102 31 194 A1 | 5/2004 |
| DE | 10 2004 054317 A1 | 5/2006 |
| DE | 10 2004 054 317 A1 | 11/2006 |
| EP | 0 898 180 A2 | 2/1999 |
| EP | 0 898 180 A3 | 2/1999 |
| EP | 1 369 816 A1 | 12/2003 |
| EP | 1 891 452 B1 | 2/2008 |
| JP | 1 184885 A | 7/1989 |
| JP | 06-055971 A | 3/1994 |
| JP | 07-036048 A | 2/1995 |
| JP | 9-79865 | 3/1997 |
| JP | 9079865 | 3/1997 |
| JP | 9-79865 | 9/1997 |
| JP | 2000-164803 A | 6/2000 |
| JP | 2000183241 | 6/2000 |
| JP | 2001-052780 A | 2/2001 |
| JP | 2001141738 | 5/2001 |
| JP | 2001 165702 | 6/2001 |
| JP | 2003177171 | 6/2003 |
| JP | 2004-062854 | 2/2004 |
| JP | 2004-153020 | 5/2004 |
| JP | 2004-301743 A | 10/2004 |
| JP | 2006-032775 A | 2/2006 |
| JP | 2006-047113 A | 2/2006 |
| WO | WO 01/23899 A1 | 4/2001 |
| WO | WO 01/74139 | 10/2001 |
| WO | WO 2005/013363 | 2/2005 |

OTHER PUBLICATIONS

Notice of Allowance in Korean Application No. 10-2009-7002133 dated Dec. 24, 2013, with English translation and English translation of allowed claims, 7 pages.

Office Action in U.S. Appl. No. 12/630,362 dated Dec. 24, 2013, 23 pages.

Hassan et al.; "The Close Attached Capacitor: A Solution to Switching Noise Problems;" IEEE Transactions on Components, Hybrids, and Manufacturing Technology, No. 6; Dec. 15, 1992; pp. 1056-1063.

Chinese Office Action dated Aug. 15, 2012; for Chinese Pat. App. No. 200780021981.6; 9 pages.

Response to Decision of Rejection filed Aug. 19, 2013 in Chinese Patent Applicaton No. 200780021981.6, 9 pages.

U.S. Appl. No. 12/630,362 Response to Office Action filed on Apr. 24, 2014, 12 pages.

Response to Japanese Office Action filed on Jul. 31, 2013 in Japanese Patent Application No. 2009-519438, and partial translation, 4 pages.

Response to Korean Office Action filed on Aug. 21, 2013 in Korean Patent Application No. 10-2009-7002133, including translations of bibliographic information, 23 pages.

Japanese Notice of Allowance in Japanese Patent Application No. 2009-519438, 4 pages.

(56) References Cited

OTHER PUBLICATIONS

EP Application No. 07 795 814.8 Office Action dated Mar. 21, 2014, 4 pages.
Office Action dated May 17, 2013 from U.S. Appl. No. 12/630,362.
Allegro Microsystems, Inc., "Dynamic Self-Calibrating Peak-Detecting Differential Hall Effect Gear Tooth Sensor" Data Sheet, Mar. 22, 2006, 2 pages.
Allegro Microsystems, Inc., "Dynamic Self-Calibrating Peak-Detecting Differential Hall Effect Gear Tooth Sensor", Worcester, MA., Jan. 2005, 14 pages.
Allegro Microsystems, Inc., "Hall-Effect IC Applications Guide", 36 pages, Sep. 14, 2009.
Allegro Microsystems, Inc., "Two-Wire True Zero-Speed Miniature Differential Peak-Detecting Sensor with Continuous Calibration" Data Sheet, Mar. 22, 2006, pp. 1-2.
Allegro Microsystems, Inc., "Two-Wire True Zero-Speed Miniature Differential Peak-Detecting Sensor with Continuous Calibration", Jan. 2005, 13 pages.
Chinese Office Action and English Transaction dated Mar. 22, 2011 for Chinese Patent Application No. 200780021981.6 filed on Dec. 12, 2008, which claims priority to present U.S. Application, 14 pages.
Infineon Technologies, Differential Two-Wire Hall Effect Sensor-IC for Wheel Speed Applications with Direction Detection, Feb. 2005, Data Sheet, V3, pp. 1-32, Infineon Technologies AG, Germany.
Infineon Technologies, Smart Hall Effect Sensor for Camshaft Applications, pp. 1-2. Infineon Technologies AG, Germany, Jan. 2003.
Motz et al., "A Chopped Hall Sensor with Small Jitter and Programmable "True Power-On" Function", IEEE Journal of Solid-State Circuits, vol. 40, No. 7, Jul. 2005, pp. 1533-1540.
Notification Concerning Transmittal of International Preliminary Report on Patentability (Chapter 1 of the Patent Cooperation Treaty), International Preliminary Report on Patentability, Written Opinion of the International Searching Authority, PCT/US2007/013358 dated Jan. 22, 2009, 7 pages.
Notification Concerning Transmittal of International Preliminary Report on Patentability (Chapter l of the Patent Cooperation Treaty), PCT/US2007/008920 dated Oct. 23, 2008, 7 pages.
Notification Concerning Transmittal of International Preliminary Report on Patentability (Chapter 1 of the Patent Cooperation Treaty), PCT/US2008/053551 dated Oct. 8, 2009, 2 pages; Written Opinion of the International Searching Authority, PCT/US2008/053551 dated Oct. 8, 2009, 5 pages.
Notification of transmittal of the International Search Report and the Written Opinion of the International Searching Authority, PCT/US2007/013358, or the Declaration dated Feb. 28, 2008, 5 pages; Written Opinion of the International Searching Authority, PCT/US2007/013358, dated Feb. 28, 2008, 7 pages.
Notification of transmittal of the International Search Report and the Written Opinion of the International Searching Authority, or the Declaration, PCT/US2007/008920 dated Oct. 23, 2007, 5 pages; Written Opinion of the International Searching Authority, PCT/US2007/008920 dated Oct. 23, 2007, 6 pages.
Notification of Transmittal of the International Search Report and the Written Opinion of the International Searching Authority, or the Declaration, PCT/US2010/056434 date of mailing Jan. 26, 2011, 5 pages; Written Opinion of the International Searching Authority, PCT/US2010/056434 date of mailing Jan. 26, 2011, 10 pages.
Notification of Transmittal of the International Search Report and the Written Opinion of the International Searching Authority, or the Declaration, dated Jul. 15, 2008, PCT/US2008/053551, 6 pages; Written Opinion of the International Searching Authority dated Jul. 15, 2008, PCT/US2008/053551, 5 pages.
Office Action dated Feb. 26, 2010 from U.S. Appl. No. 11/693,183, 21 pages.
Response to Office Action dated Feb. 26, 2010 as filed on Jun. 9, 2010, 7 pages.
Second and Supplementary Notice Information the Applicant of the Communication of the International Application (to Designated Office Which Apply the 30 Month Time Limit Under Article 22(1), PCT/US2007/008920 dated Aug. 14, 2008, 1 page.

Seyed Hassan Hashemi: "The Close Attached Capacitor: A Solution to Switching Noise Problems", IEEE Transactions on Components, Hybrids, and Manufacturing Technology, IEEE Inc. New York, US, vol. 15, No. 6, Dec. 1, 1992 (Feb. 1, 1992), pp. 1056-1063, XP000364765. ISSN: 0148-6411.
Stauth; "Integrated Current Sensor;" U.S. Appl. No. 10/831,906, filed Apr. 26, 2004; 34 pages.
True Zero-Speed Low-Jitter High Accuracy Gear Tooth Sensor, ATS625LSG,2005, pp. 1-21, Allegro MicroSystems, Inc., Worcester, MA 01615.
Two-Wire True Zero Speed Miniature Differential Peak-Detecting Gear Tooth Sensor, ATS645LSH, 2004, pp. 1-14, Allegro MicroSystems, Inc., Worcester, MA 01615.
File downloaded for U.S. Appl. No. 10/831,906, filed Apr. 26, 2004, less IDSs and references already cited, file through Mar. 23, 2012, 260 page.
File downloaded for U.S. Appl. No. 11/279,780, filed Apr. 14, 2006, less IDSs and references already cited, file through Mar. 23, 2012, 417 pages.
File downloaded for U.S. Appl. No. 11/554,619, filed Oct. 31, 2006, less IDSs and references already cited, file through Mar. 23, 2012, 626 pages in two parts.
File downloaded for U.S. Appl. No. 11/693,183, filed Mar. 29, 2007, less IDSs and references already cited, file through Mar. 23, 2012, 277 pages.
File downloaded for U.S. Appl. No. 11/877,144, filed Oct. 23, 2007, less IDSs and references already cited, file through Mar. 23, 2012, 282 pages.
File downloaded for U.S. Appl. No. 12/630,362, filed Dec. 3, 2009, less IDSs and references already cited, file through Mar. 23, 2012, 1857 pages in five parts.
Office Action dated Aug. 14, 2014 for U.S. Appl. No. 12/630,362, filed Dec. 3, 2009 35 pages.
Japanese Office Action with English translation dated Oct. 28, 2014; for Japanese Pat. App. No. 2013-197704; 6 pages.
Letter to Yuasa and Hara dated Mar. 4, 2015; for Japanese Pat. App. No. 2013-197704; 2 pages.
Japanese Claims filed on Feb. 27, 2015; for Japanese Pat. App. No. 2013-197704; 2 pages.
Japanese Argument and Amendment filed on Feb. 27, 2015; for Japanese Pat. App. No. 2013-197704; 9 pages.
Office Action dated Apr. 15, 2015 for U.S. Appl. No. 12/630,362; 21 pages.
Chinese Patent Application No. 200780021981.6 Notification of Reexamination dated May 5, 2015, including English translation, 22 pages.
European Patent Application No. 07795814.8 Response to Examination Report filed on Sep. 2014, 13 pages.
Response to Office Action dated Aug. 17, 2015; for U.S. Appl. No. 12/630,362; 19 pages.
Japanese Notice of Reason for Rejection (with English translation) dated Aug. 7, 2015; for Japanese Pat. App. No. 2013-197704; 7 pages.
Chinese Patent Application No. 200780021981.6 Response to Office Action as filed and English translation of substance of response from Chinese associate, 12 pages.
U.S. Appl. No. 14/741,644, filed Jun. 17, 2015, Taylor et al.
Notification Concerning Transmittal of International Preliminary Report on Patentability (Chapter 1 of the Patent Cooperation Treaty), PCT/US2010/056434, date of issuance Jun. 5, 2012, 12 pages.
German Patent Application No. 11 2010 004 674.3 Office Action dated Apr. 14, 2015 including translation, 9 pages.
German Patent Application No. 11 2010 004 674.3 Response to Office Action filed Aug. 14, 2015, including translation of amended claims, 16 pages.
U.S. Appl. No. 12/630,362 RCE and Amendment filed Feb. 12, 2015, 19 pages.
Chinese Patent Application No. 200780021981.6 Decision of Reexamination dated Sep. 15, 2015 including Chinese Associate cover letter dated Sep. 29, 2015, 17 pages. (translation of Notification of the Reexamination dated May 5, 2015 previously cited May 26, 2015).

\* cited by examiner

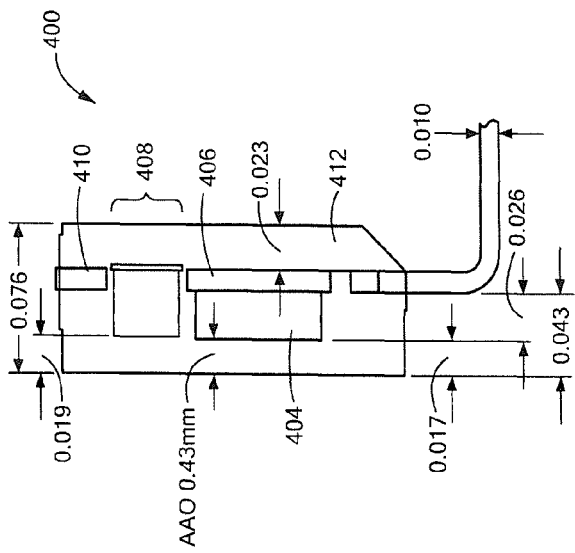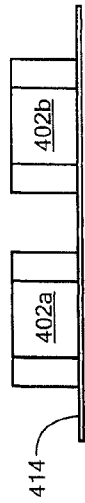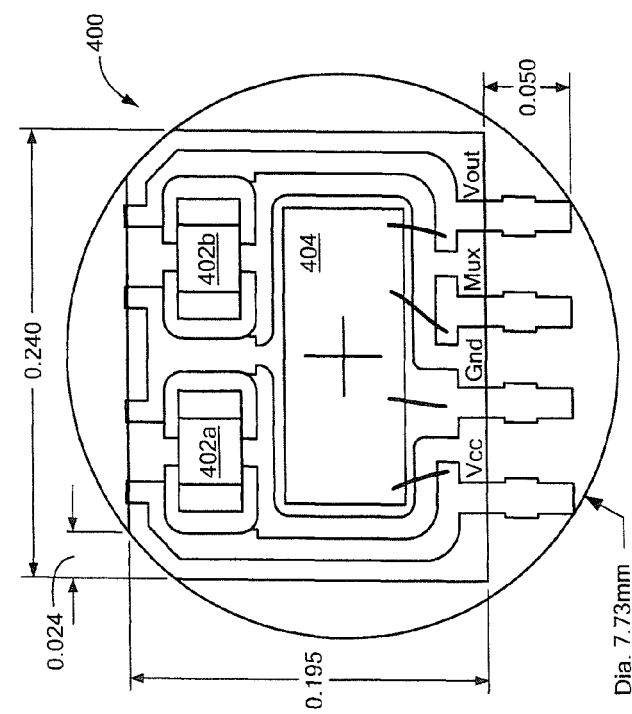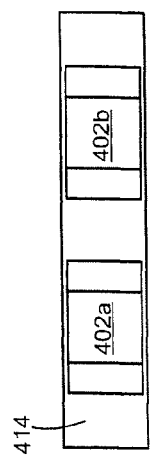

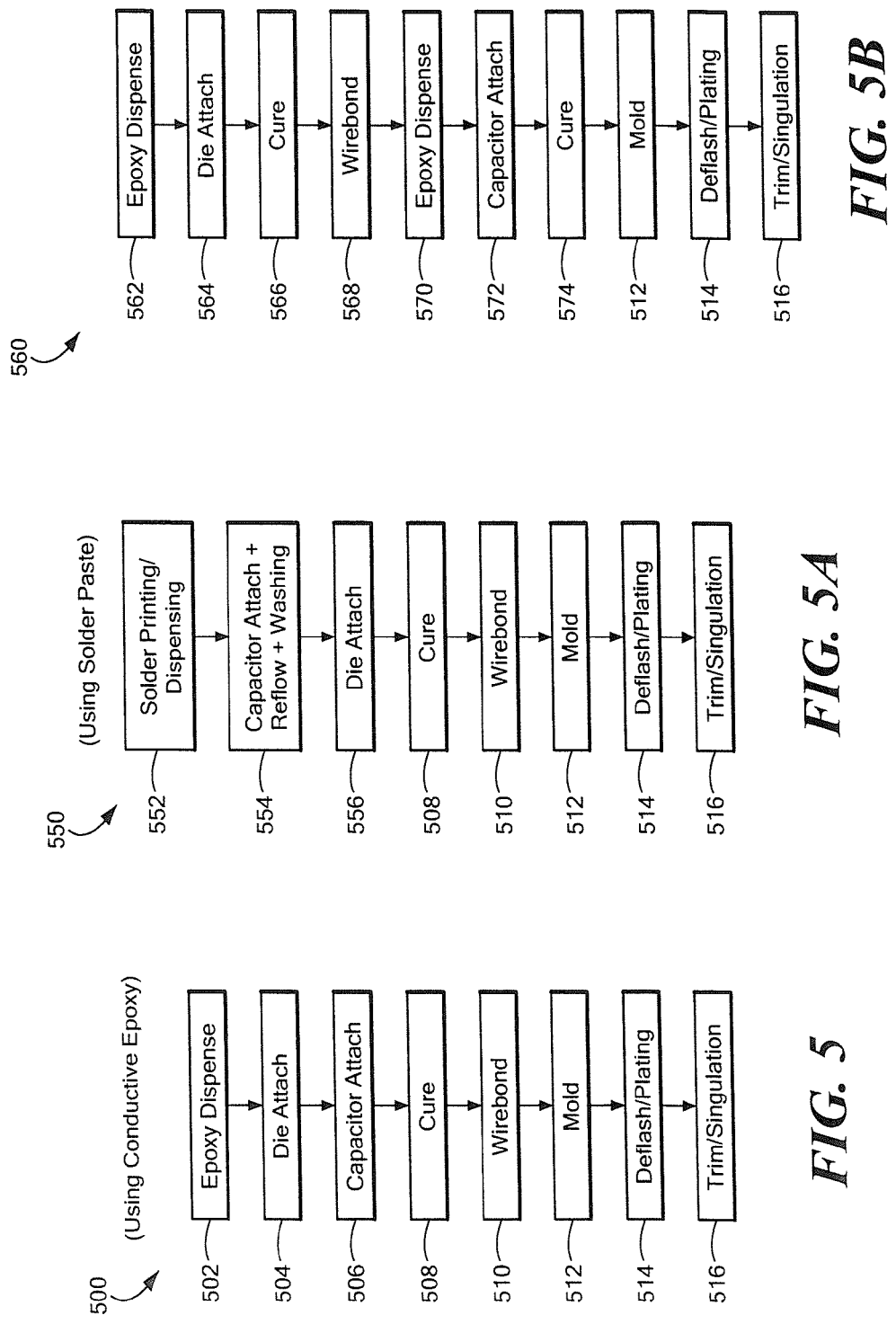

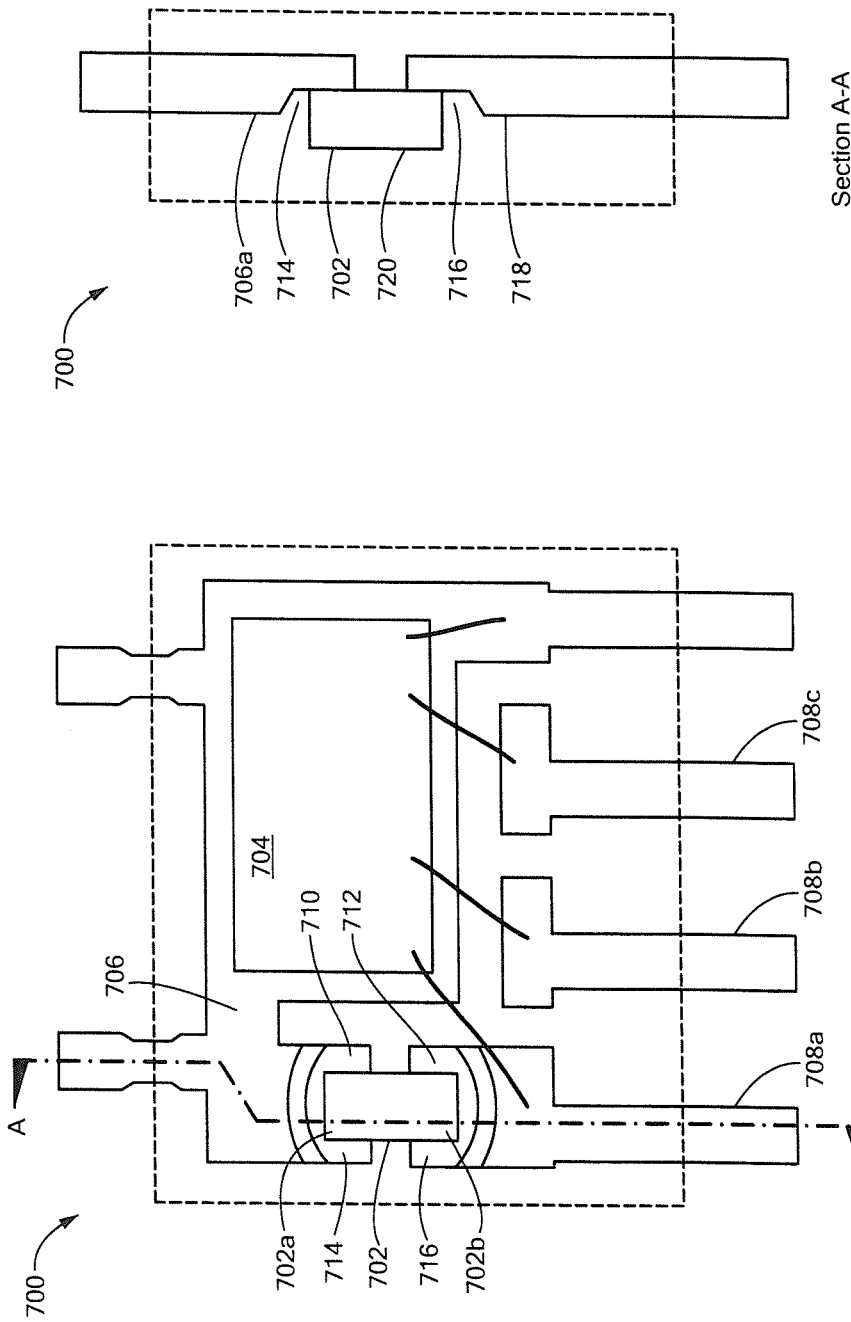

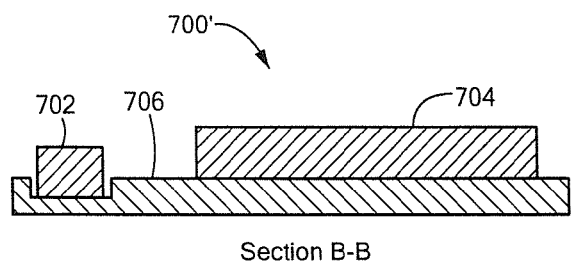
Section B-B
*FIG. 8C*
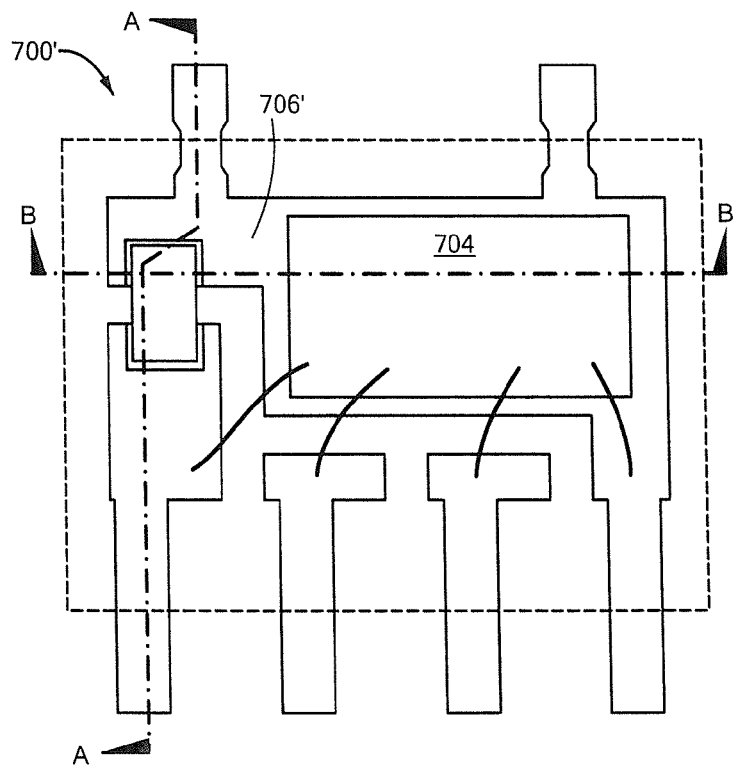 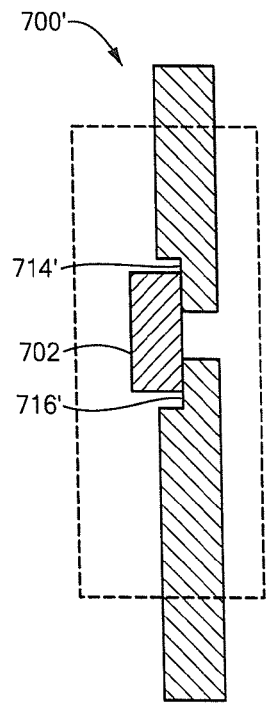
Section A-A
*FIG. 8A*  *FIG. 8B*

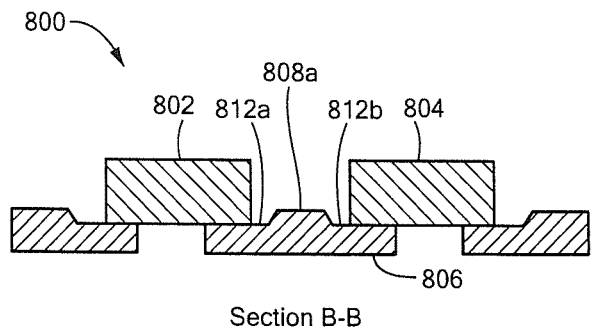
Section B-B
FIG. 9C
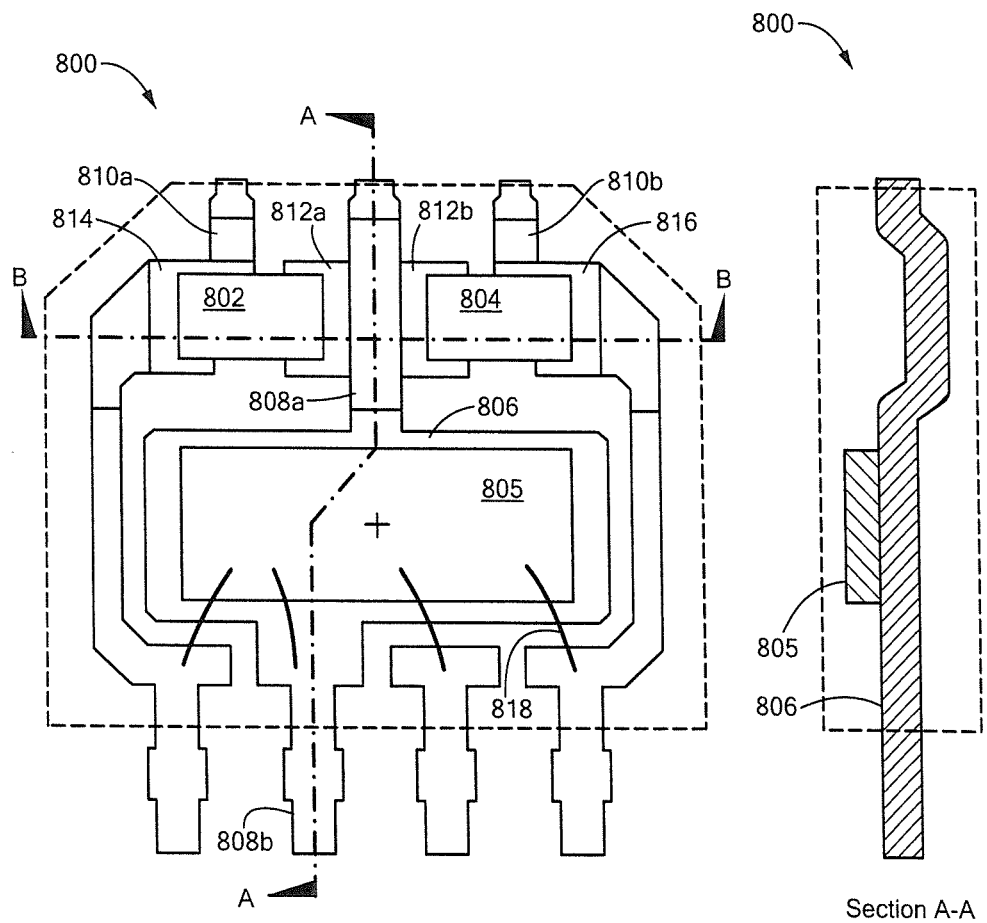
FIG. 9A
FIG. 9B
Section A-A

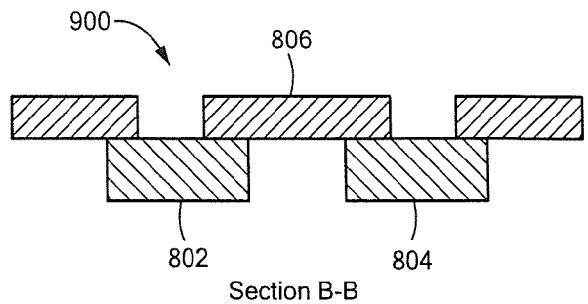
*FIG. 10D*
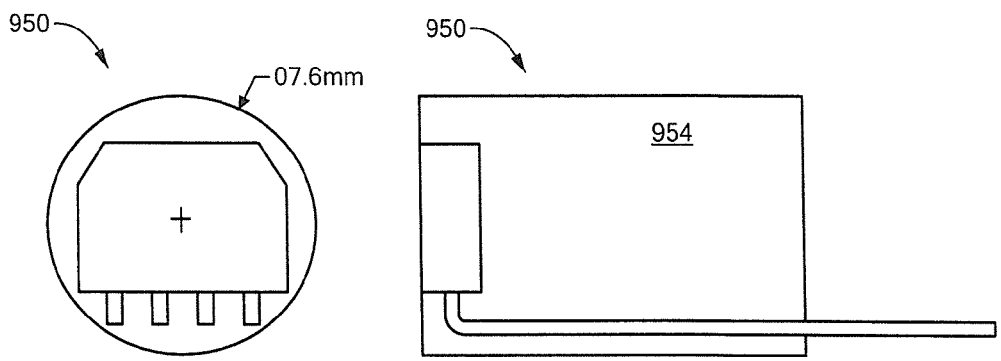
*FIG. 11A*  *FIG. 11B*
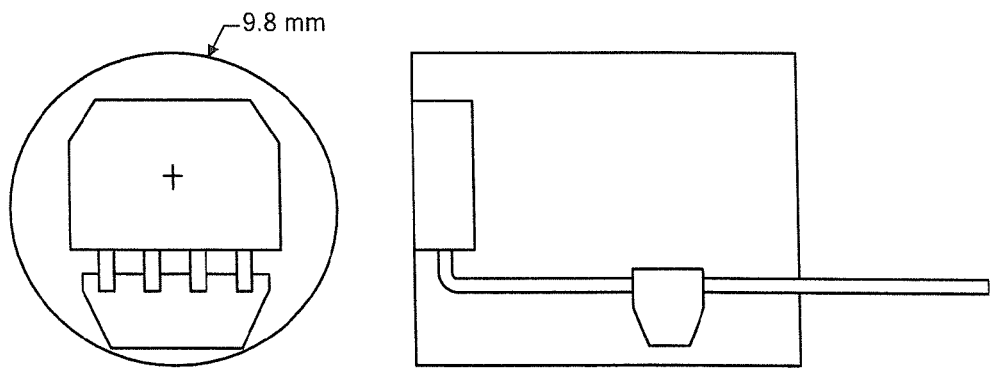
*FIG. 12A*  *FIG. 12B*
PRIOR ART  PRIOR ART

SENSOR AND METHOD OF PROVIDING A SENSOR This application is a continuation of U.S. patent application Ser. No. 11/457,626 filed on Jul. 14, 2006, which is incorporated herein by reference.

BACKGROUND

Techniques for semiconductor packaging are well known in the art. In general, a die is cut from a wafer, processed, and attached to a leadframe. After assembly of the integrated circuit (IC) package, the IC package may then placed on a circuit board with other components, including passive components such as capacitors, resistors and inductors. Such passive components, which can be used in filtering the like, can result in the addition of a circuit board near the sensor, or additional real estate on a circuit board that may be present.

As is known in the art, integrated circuits (ICs) are typically overmolded with a plastic or other material to form a package. Such ICs, for example sensors, often require external components, such as capacitors, to be coupled to the IC for proper operation. Magnetic sensors, for example, can require decoupling capacitors to reduce noise and enhance EMC (electromagnetic compatibility). However, external components require real estate on a printed circuit board (PCB) and additional processing steps.

U.S. Pat. No. 5,973,388 to Chew et al. discloses a technique in which a leadframe includes a flag portion and a lead portion with a wire bonds connecting a die to the leadframe. Inner ends of the lead portions are etched to provide a locking structure for epoxy compound. The assembly is then encapsulated in an epoxy plastic compound.

U.S. Pat. No. 6,563,199 to Yasunaga et al. discloses a lead frame with leads having a recess to receive a wire that can be contained in resin for electrical connection to a semiconductor chip.

U.S. Pat. No. 6,642,609 to Minamio et al. discloses a leadframe having leads with land electrodes. A land lead has a half-cut portion and a land portion, which is inclined so that in a resin molding process the land electrode adheres to a seal sheet for preventing resin from reaching the land electrode.

U.S. Pat. No. 6,713,836 to Liu et al, discloses a packaging structure including a leadframe having leads and a die pad to which a chip can be bonded. A passive device is mounted between the contact pads. Bonding wires connect the chip, passive device, and leads, all of which are encapsulated.

U.S. Patent Application Publication No. US 2005/0035448 of Hsu et al. discloses a chip package structure including a carrier, a die, a passive component, and conducting wires. Electrodes of the passive component are coupled to power and ground via respective conducting wires.

BRIEF DESCRIPTION OF THE DRAWINGS

The exemplary embodiments contained herein will be more fully understood from the following detailed description taken in conjunction with the accompanying drawings, in which:

FIG. 4A is a top view of a sensor having integrated capacitors in accordance with an exemplary embodiment of the invention;

FIG. 4B is a side view of the sensor of FIG. 4A;

FIG. 4C is a top view of the capacitors of FIG. 4A;

FIG. 4D is a side view of the capacitors of FIG. 4C;

FIG. 5 is a flow diagram showing an exemplary sequence of steps to fabricate the sensor of FIG. 4A;

FIG. 5A is a flow diagram showing an alternative sequence of steps to fabricate a sensor in accordance with exemplary embodiments of the invention;

FIG. 5B is a flow diagram showing a further sequence of steps to fabricate a sensor in accordance with exemplary embodiments of the invention;

FIG. 7A is a top view of a capacitor coupled to a leadframe;

FIG. 7B is a cross-sectional view of the assembly of FIG. 7A;

FIG. 8A is a top view of a capacitor coupled to a leadframe;

FIG. 8B is a cross-sectional view of the assembly of FIG. 8 along lines A-A;

FIG. 8C is a cross-sectional view of the assembly of FIG. 8 along lines B-B;

FIG. 9A is a top view of a capacitor coupled to a leadframe;

FIG. 9B is a cross-sectional view of the assembly of FIG. 9A along lines A-A;

FIG. 9C is a cross-sectional view of the assembly of FIG. 9A along lines B-B;

FIG. 10D is a cross-sectional view of the assembly of FIG. 10 along lines C-C;

FIG. 11A is a front view of a sensor having an integrated capacitor;

FIG. 11B is a side view of the sensor of FIG. 11A;

FIG. 12A is a front view of a prior art sensor;

FIG. 12B is a side view of the prior art sensor of FIG. 12A; and

DETAILED DESCRIPTION

Figure 1:
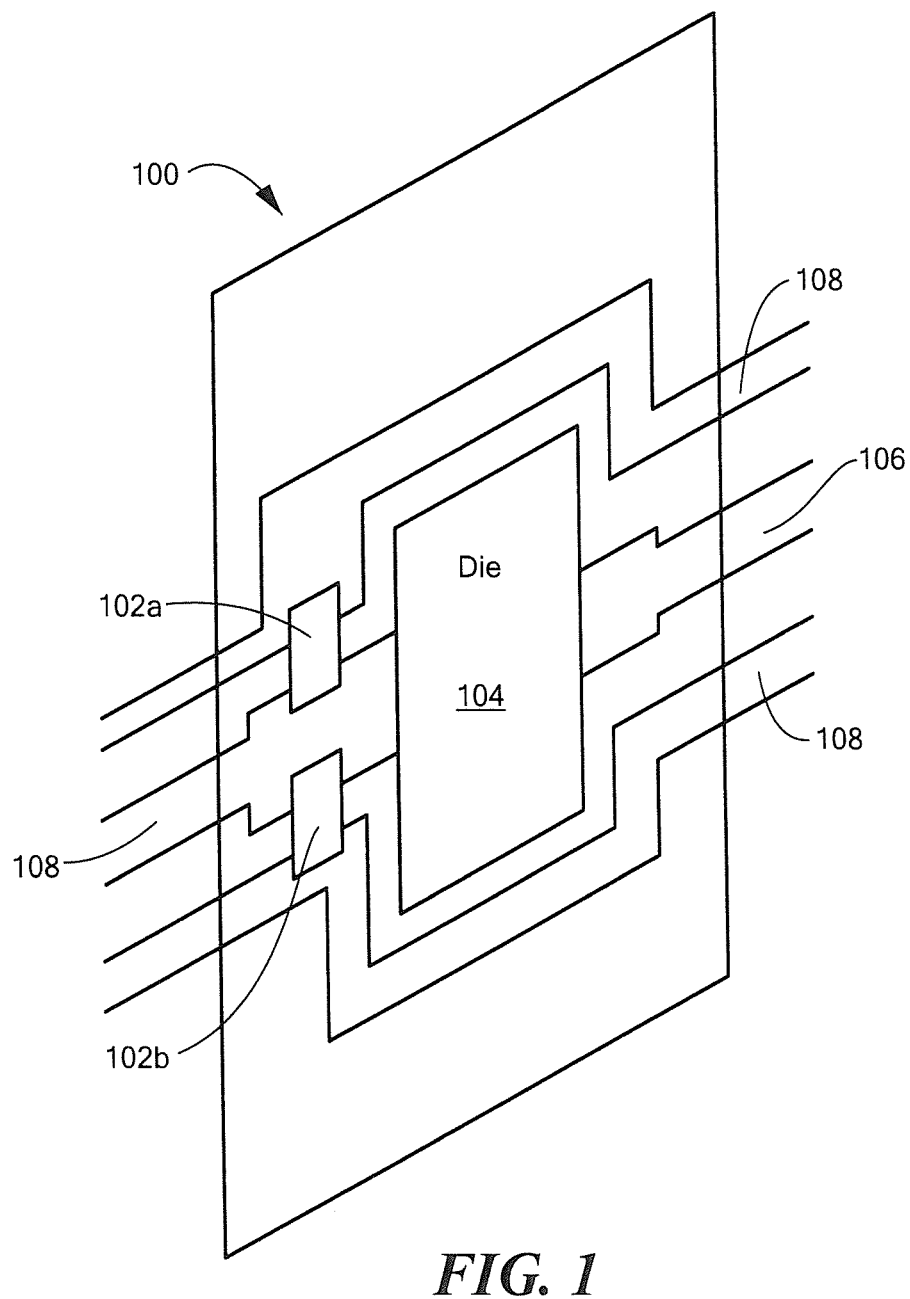
FIG. 1 is a pictorial representation of a sensor having an integrated capacitor in accordance with exemplary embodiments of the invention.

FIG. 1 shows an integrated circuit (IC) package 100 having integrated capacitors 102*a,b* in accordance with an exemplary embodiment of the invention. In the illustrated embodiment, the IC package 100 includes a die 104 having a magnetic sensor to detect a magnetic field, or change in magnetic field, which may change with the movement of an object of interest. The die 104 and capacitor(s) 102 can be positioned on a leadframe 106 having a series of lead fingers 108.

By integrating one or more capacitors 102 in accordance with exemplary embodiments described more fully below, the vertical direction of the package, or the magnetic field, is either minimally or not impacted, e.g., increased, as compared with known sensor packages. As will be appreciated by one of ordinary skill in the art, it is desirable for sensor ICs to minimize a distance between the sensor package and the object of interest.

Figure 2A:
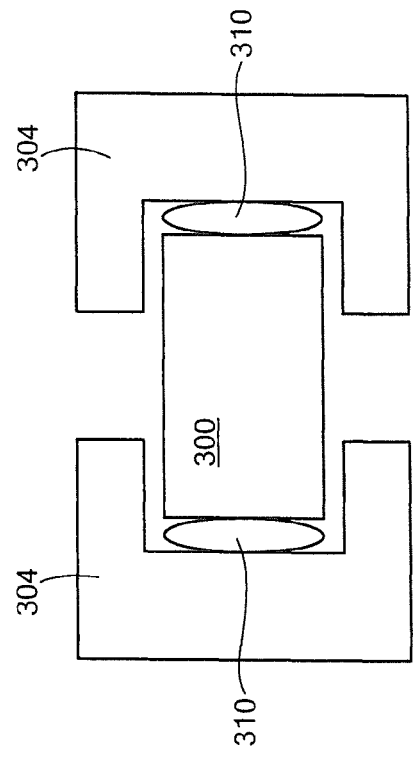
FIG. 2A is a top view of a capacitor and leadframe.
Figure 2B:
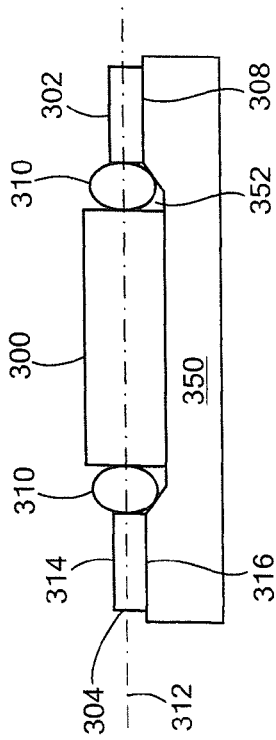
FIG. 2B is a side view of the capacitor and leadframe of FIG. 2A.

FIGS. 2A and 2B show a capacitor 200 placed on tape 202, such as KAPTON tape, in a region 204 defined by a leadframe 206. More particularly, the leadframe is formed, cut, or otherwise manipulated to form the region 204 for the capacitor 200. The capacitor 200 is below a surface 208 of the leadframe 206 so that a vertical dimension of the package is reduced when compared to the capacitor on the leadframe.

The capacitor 200 is electrically coupled to the leadframe 206 using any suitable technique, such as wire-bonding, solder, conductive epoxy, etc. In certain embodiments, wire-bonding and/or conductive epoxy may be preferred as solder may potentially crack at the interface with the capacitor or leadframe due to thermal expansion caused by coefficient of thermal expansion (CTE) mismatches over temperature cycles.

Figure 3A:
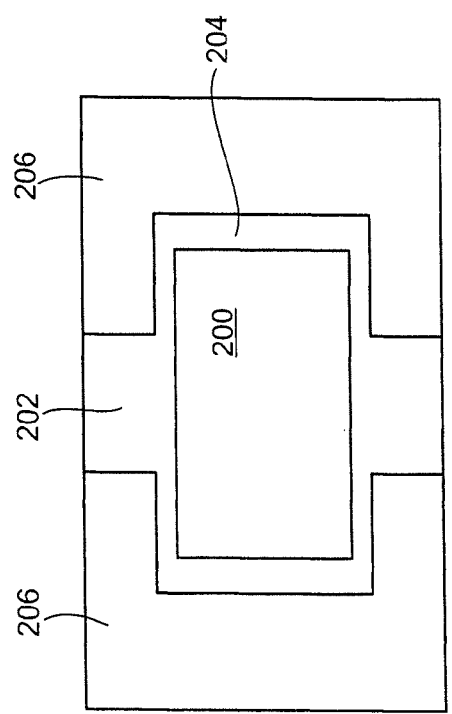
FIG. 3A is a top view of a capacitor secured to a leadframe by conductive epoxy.
Figure 3B:
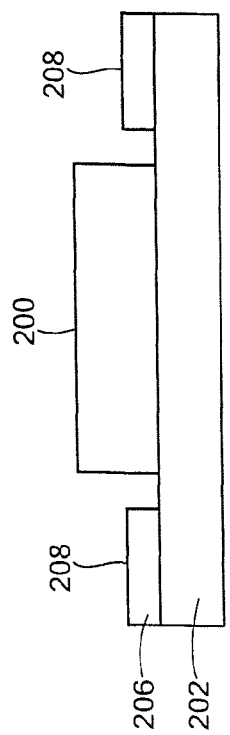
FIG. 3B is a side view of the assembly of FIG. 3A.

FIGS. 3A and 3B show another embodiment of a sensor having a capacitor 300 located below a surface 302 of a leadframe 304. In the illustrated embodiment, a bottom 306 of the capacitor is below a bottom surface 308 of the leadframe 304. Conductive epoxy 310 is used to electrically connect and secure the capacitor 300 to the leadframe 304. With this arrangement, more of a body of the package for the sensor can be used in the vertical direction for package thickness. This direction is a significant factor in the operation of magnetic sensors as will be readily appreciated by one of ordinary skill in the art.

In an exemplary embodiment, a capacitor 300 is placed below a leadframe 302 and electrically connected to the leadframe and secured in position by the conductive epoxy 310. In one embodiment, the capacitor 300 is generally centered on a longitudinal center 312 of the leadframe 302. That is, an equal portion of the capacitor is above the top surface 314 and below the bottom surface 316 of the leadframe. However, in other embodiments, the capacitor 300 can be positioned differently with respect to the leadframe 302.

In an exemplary embodiment, an assembly fixture 350 (FIG. 3B) to position the capacitor 300 in relation to the leadframe 302 includes a tray 352 to provide a depression to secure the capacitor 300 in position during the assembly process. A die, for example silicon, would also be present on another portion of the leadframe, but is not shown for clarity. The tray 352 can be positioned to place the capacitor in a desired position with respect to the leadframe 302 while the conductive epoxy 310 is applied and cured. After the epoxy, or other connecting means, has cured, or set the tray may be removed and a mold compound, for example, can be over molded about the assembly to form an IC package.

In another embodiment, solder is used to electrically connect and secure the capacitor to the leadframe. It is understood that other suitable materials can be used that can withstand mechanical forces present during the plastic package injection molding process.

FIGS. 4A and 4B show a further embodiment of an IC package 400 having first and second integrated capacitors 402a,b and illustrative dimensions in accordance with an exemplary embodiment of the invention. A die 404 is connected to a leadframe 406 having a cutout region 408 in which the capacitors 402 can be positioned below a surface 410 of the leadframe 406. A plastic or other material can be used as molding 412 to encapsulate the assembly.

As shown in FIGS. 4C and 4D, in the illustrated embodiment, the capacitors 402 are mounted on tape 414, such as polyimide tape (KAPTON is one trade name for polyimide tape) with conductive foil. A tape automated bonding process (TAB) with a continuous reel can be used for the capacitors 402. With this arrangement, the assembly will remain intact during the molding process. With the capacitors 402 placed below the leadframe surface 410, the required thickness of the package is reduced as compared with a package having a capacitor mounted on the leadframe.

In the illustrative package of FIGS. 4A and 4B, the IC package 400 having integrated capacitors 402a,b is a Hall effect sensor. As is well known in the art, the sensor 400 is useful to detect movement of an object of interest by monitoring changes in a magnetic field.

The exemplary sensor package 400 has dimensions of about 0.24 inch long, about 0.184 inch wide, and about 0.76 inch deep, i.e., thickness. The leadframe 406 is about 0.01 inch in thickness with the cutout region about 0.04 inch to enable placement of the capacitors 402 below the leadframe surface.

The capacitive impedance provided by the capacitors can vary. In general, the capacitance can range from about 500 pF to about 200 nF.

Figure 4F:
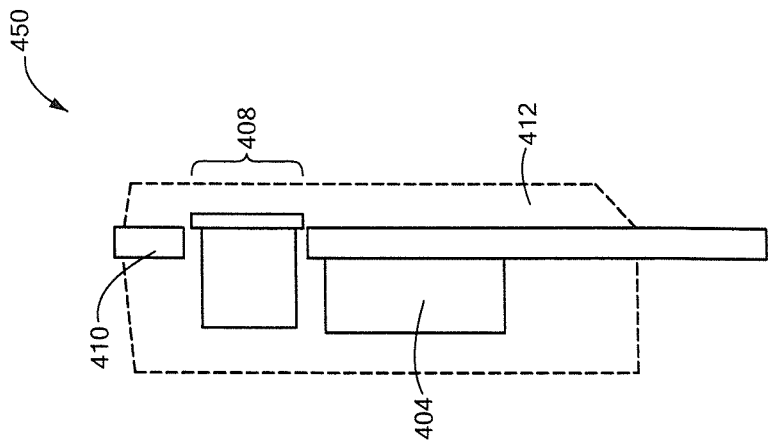
FIG. 4F is a side view of the sensor of FIG. 4E.
Figure 4E:
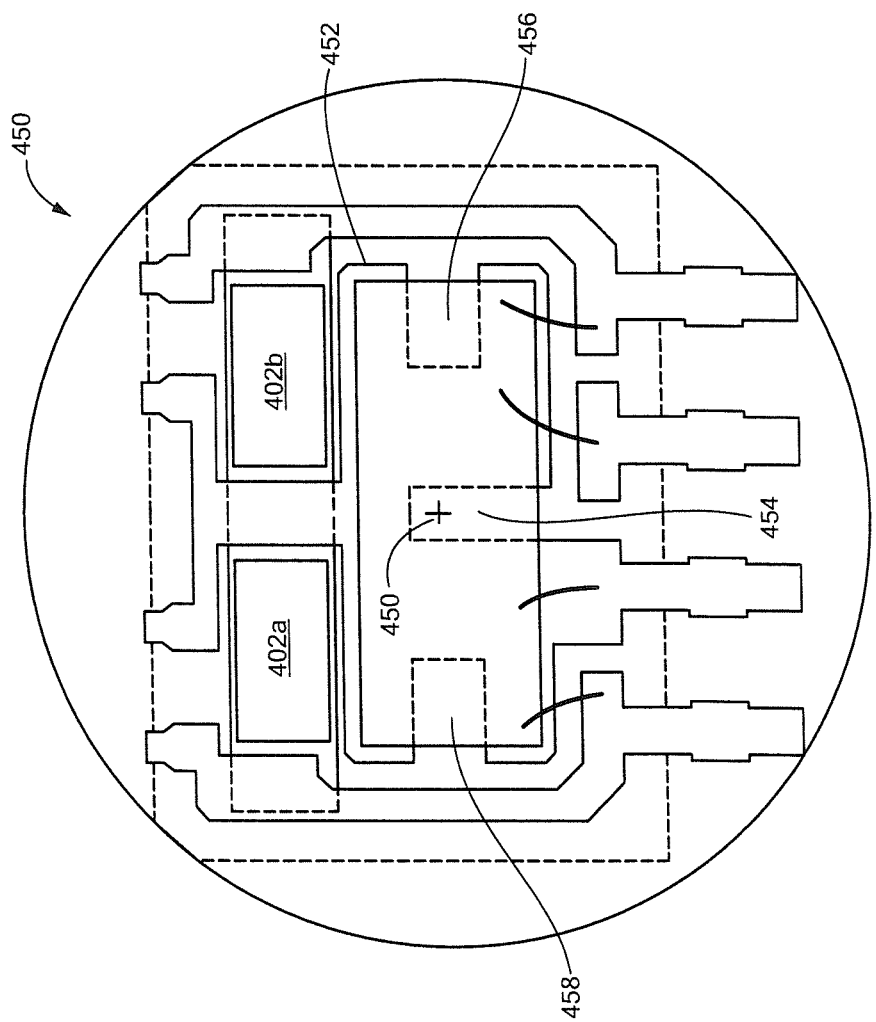
FIG. 4E is a top view of a sensor having integrated capacitors in accordance with an exemplary embodiment of the invention.

FIGS. 4E-F show another sensor package embodiment 450 including integrated capacitors 402a, 402b having a leadframe 452 with a first slot 454 to reduce eddy currents in accordance with exemplary embodiments of the invention. In other embodiments, further slots 456, 458 can be provided in the leadframe. The sensor 450 has some commonality with the sensor 400 of FIG. 4A, where like reference numbers indicate like elements.

As is well known in the art, in the presence of an AC magnetic field (e.g., a magnetic field surrounding a current carrying conductor), AC eddy currents can be induced in the conductive leadframe 452. Eddy currents form into closed loops that tend to result in a smaller magnetic field so that a Hall effect element experiences a smaller magnetic field than it would otherwise experience, resulting in a less sensitivity. Furthermore, if the magnetic field associated with the eddy current is not uniform or symmetrical about the Hall effect element, the Hall effect element might also generate an undesirable offset voltage.

The slot(s) 454 tends to reduce a size (e.g., a diameter or path length) of the closed loops in which the eddy currents travel in the leadframe 452. It will be understood that the reduced size of the closed loops in which the eddy currents travel results in smaller eddy currents for a smaller local affect on the AC magnetic field that induced the eddy current. Therefore, the sensitivity of a current sensor having a Hall effect 460 element is less affected by eddy currents due to the slot(s) 454.

Instead of an eddy current rotating about the Hall effect element 460, the slot 454 results in eddy currents to each side of the Hall element. While the magnetic fields resulting from the eddy currents are additive, the overall magnitude field strength, compared to a single eddy current with no slot, is lower due to the increased proximity of the eddy currents.

It is understood that any number of slots can be formed in a wide variety of configurations to meet the needs of a particular application. In the illustrative embodiment of FIG. 4E, first, second and third slots 454, 456, 458 are formed in the leadframe 452 in relation to a Hall effect element 460 centrally located in the die. The slots reduce the eddy current flows and enhance the overall performance of the sensor.

It is understood that the term slot should be broadly construed to cover generally interruptions in the conductivity of the leadframe. For example, slots can includes a few relatively large holes as well as smaller holes in a relatively high density. In addition, the term slot is not intended to refer to any particular geometry. For example, slot includes a wide variety of regular and irregular shapes, such as tapers, ovals, etc. Further, it is understood that the direction of the slot(s) can vary. Also, it will be apparent that it may be desirable to position the slot(s) based upon the type of sensor.

The slotted leadframe 452 can be formed from a metal layer of suitable conductive materials including, for example, aluminum, copper, gold, titanium, tungsten, chromium, and/or nickel.

FIG. 5 shows a process 500 having an exemplary sequence of steps to provide a sensor having one or more integrated capacitors. In step 502, conductive epoxy is applied to a desired location and in step 504 a die is attached to a leadframe. In step 506, a capacitor is attached to the leadframe by the conductive epoxy. The assembly is cured in step 508 followed by wirebonding lead fingers to the die in step 510. The assembly is then overmolded with a plastic material, for example, in step 512 followed by finishing steps 514, 516 of deflash/plating and trimming/singulation.

Alternatively a flip-chip attachment could be used in which solder balls and/or bumps are applied to the die, which is then attached to the leadframe. A capacitor is attached to the leadframe followed by overmolding of the assembly after solder reflow.

FIG. 5A shows an alternative embodiment 550 of the process 500 of FIG. 5 in which solder is used instead of conductive epoxy, wherein like reference numbers indicate like elements. In step 552, solder is printed or otherwise dispensed in desired locations for attachment of capacitors in step 554. In step 556, the die is attached to the leadframe followed by curing etc in a manner similar to that of FIG. 5. FIG. 5B shows a further alternative embodiment 560 that may reduce cracking during wirebonding. In step 562, epoxy is dispensed and in step 564 the die is attached. The epoxy is then cured in step 566 followed by wirebonding in step 568. Then the capacitor is attached in step 572 and the assembly is cured in step 574 followed by molding, deflash/plating and trimming/singulation in respective steps 512, 514, 516.

It is understood that the illustrative process embodiments are exemplary. In addition, all steps may not be shown, for example, typically after molding the package the leads are plated, trimmed and then formed. It would also be possible to attach the capacitor with one type of solder and then the die can be flip chip attached to the leadframe with a second type of solder. Further, the process steps may be reversed depending on which solder has the higher reflow temperature. The higher temperature solder should be used first. The case of flip chip attach of the die and then the capacitors with an epoxy would also be possible.

It is understood that a variety of attachment mechanisms can be used to secure and/or electrically connect the capacitor and leadframe. Exemplary mechanisms include tape and conductive epoxy, solder, tape and wire bonds, TAB (tape automated bonding), and non-conductive epoxy and wire bonding.

Figure 6B:
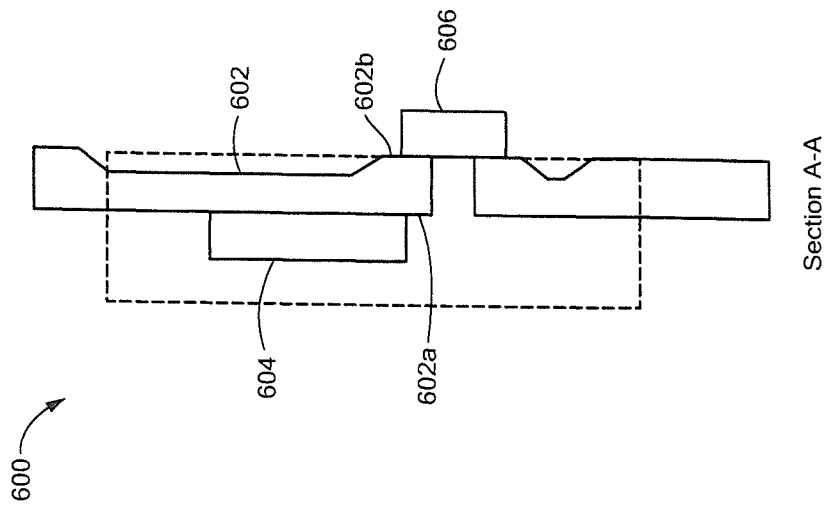
FIG. 6B is a cross-sectional view of the assembly of FIG. 6A.
Figure 6A:
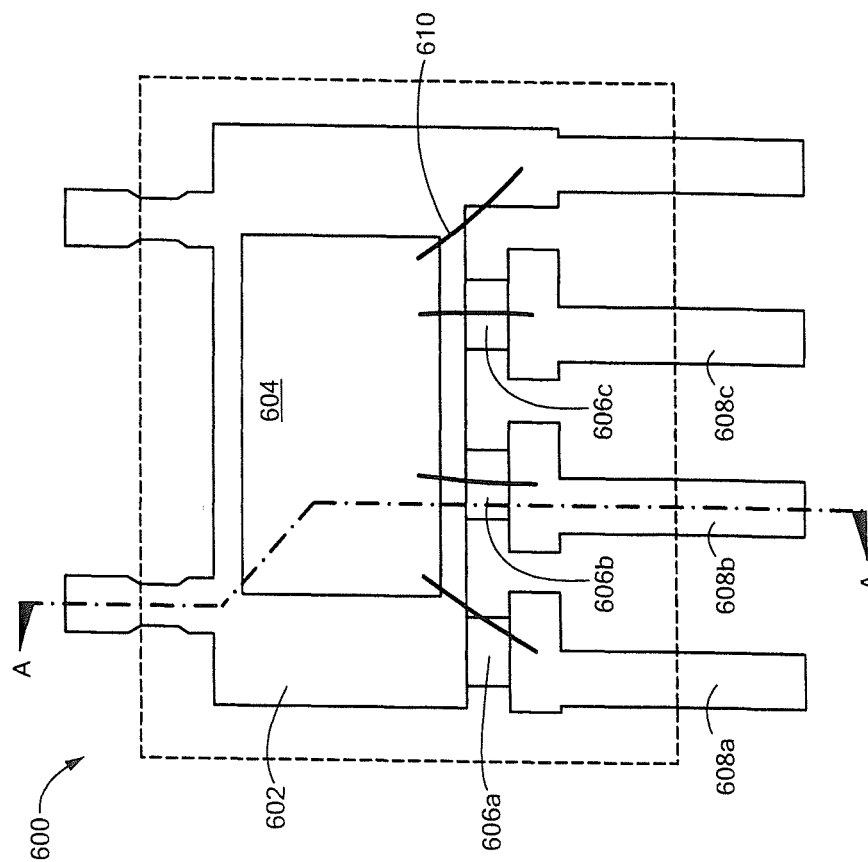
FIG. 6A is a top view of a capacitor coupled to a leadframe in accordance with exemplary embodiments of the invention.

FIGS. 6A and 6B show a semiconductor package structure 600 including a leadframe 602 to which a die 604 and components 606*a, b, c* are attached. In general, components, such as capacitors and passive devices, can be coupled to the leadframe and fingers. This arrangement enhances the life cycle of components, such as passive components, improves noise reduction capability, and creates more space on printed circuit boards.

A series of unattached lead fingers 608*a, b, c* are positioned in a spaced relationship to the leadframe 602 to enable finger-leadframe connection via respective components 606*a, b, c* in the illustrated embodiment. The die 604 is positioned on a top surface 602*a* of the leadframe 602 and one or more of the components 606 are attached to a bottom surface 602*b* of the leadframe. The components 606 can also be coupled to a lead finger to electrically connect the lead finger 608 to the leadframe 602. Wire bonds 610, for example, can be used to make electrical connections between the die 604 and the leadframe.

With this arrangement, passive component integration can be achieved on a leadframe pad using one or more matured surface mount technology (SMT) process, such as screen printing, dispensing, surface mount device attachment, etc.

The leadframe 602 and/or lead fingers 608 can be fabricated by etching, stamping, grinding and/or the like. The passive component 606 attachment can be performed before singulation and package body molding so that the singulation process will not adversely affect the quality of the internal components. As is known in the art, and disclosed for example in U.S. Pat. No. 6,886,247 to Drussel, et al., singulation refers to the separation of printed circuit boards from the interconnected PCB's in the panel of substrate material.

Figure 6C:
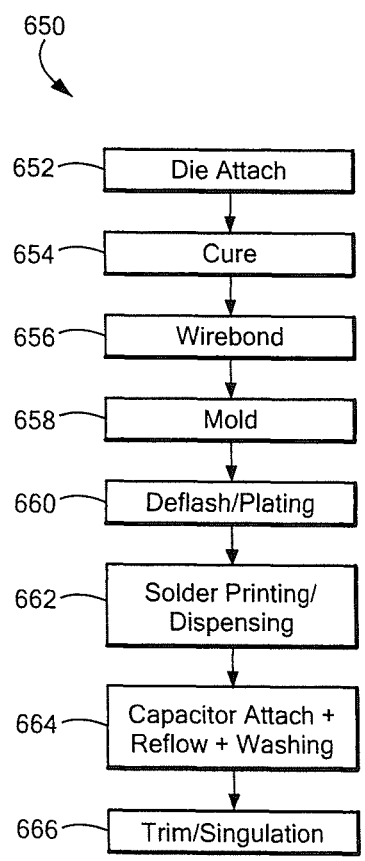
FIG. 6C is a flow diagram showing an exemplary sequence of steps to fabricate the assembly of FIG. 6A.

FIG. 6C shows an exemplary sequence of steps 650 for fabricating the assembly of FIGS. 6A and 6B. In step 652, the die is attached to the leadframe followed by curing in step 654. After curing, wirebonds are attached in step 656 and the assembly is then molded in step 658 and deflashed/plated in step 660. In step 662, solder is printed or otherwise dispensed followed by attachment of the capacitor(s), solder reflow, and washing in step 664. In step 666, trimming and singulation is performed. In the illustrated embodiment, the copper of leadframe is exposed for attachment of the capacitor to the package after the molding is completed.

FIGS. 7A and 7B show an assembly 700 having an embedded capacitor 702 provided using an integration approach. A die 704 is positioned on a top surface 706*a* of a leadframe 706 with lead fingers 708*a, b, c* positioned with respect to the leadframe. The capacitor 702, or other component, has a first end 702*a* placed on a first bonding pad 710 on the leadframe and a second end 702*b* placed on a second bonding pad 712 on the first lead finger 708*a*. The leadframe has a downset area 714 having a surface that is below a top surface 706*a* of the leadframe to receive the capacitor 702. Similarly, the first lead finger 708*a* has a downset area 716 below a top surface 718 of the lead finger to receive the capacitor second end 702*b*.

With this arrangement, the top surface 720 of the capacitor is lowered with respect to the top surface 706*a* of the leadframe due to the downset areas 714, 716 of the leadframe and the first lead finger.

An exemplary impedance range for the capacitors is from about 500 pF to about 100 nF. It is understood that a variety of capacitor types and attachment technology techniques can be used to provide sensors having integrated capacitors. In one particular embodiment, surface mount capacitors are used having exemplary dimensions of 1.6 mm long by 0.85 mm wide by 0.86 mm thick.

FIGS. 8A-C show another embodiment 700' having some commonality with the assembly of FIGS. 2A and 2B. The downset areas 714', 716' are formed as squared grooves in the respective leadframe 706' and first lead finger 708'*a*.

An integrated circuit having an integrated capacitor is useful for applications requiring noise filtering at its input or output, such as with a bypass capacitor. For example, positions sensors, such as Hall effect devices, often use bypass capacitors in automotive applications.

FIGS. 9A-C show a further embodiment 800 of an assembly having first and second integrated components 802, 804. A die 805 is positioned on a leadframe 806 having first and second 808a, b lead fingers extending from the lead frame. Further lead fingers 810a-e, which are separate from the leadframe 806, are in spaced relation to the leadframe. The first intact lead finger 808a has first and second downset areas 812a, b on outer areas of the lead finger to receive ends of the first and second components 802, 804. First and second detached lead fingers 810a, b have respective downset areas 814, 816 to receive the other ends of the first and second components 802, 804. The components 802, 804 provide the desired electrical connection as shown. Wire bonds 818 can provide electrical connections between the lead fingers and the die 805.

In the illustrated embodiment, the lead fingers 808a, 810a,b are coined to provide the downset areas 812, 814, 816. By placing the components, e.g., capacitors, inductors, resistors, etc., in the coined downset areas, the thickness of the overall package is reduced.

Such an arrangement provides advantages for a magnetic field sensor since the package thickness may be reduced. That is, an inventive sensor having an integrated component can have the same thickness as a comparable conventional sensor without an integrated component. It is readily understood by one of ordinary skill in the art that the magnetic gap is a parameter of interest for magnetic sensors and the ability to reduce a package thickness may provide enhanced magnetic sensor designs.

FIGS. 9D-G show another embodiment 800' of an assembly having first and second components 802, 804, integrated in package, such as a magnetic sensor. The embodiment 800' has some similarity with the embodiment 800 of FIGS. 9A-C, where like reference numbers indicate like elements. The components 802, 804 are secured to the leadframe 806' without downset areas. The components 802, 804 are located on an opposite side of the die 805 as wirebonds 818 used to connect various die locations to the leadfingers. The components 802, 804 are on the opposite side of the die as the leads 820 that extend from the package. In the illustrated embodiment, the tie bars proximate the components 802, 804 are cut or trimmed from the final package. By placing the components 802, 804 on an opposite side of the die 805 as external leads 820, a more compact package is provided.

Figure 9F:
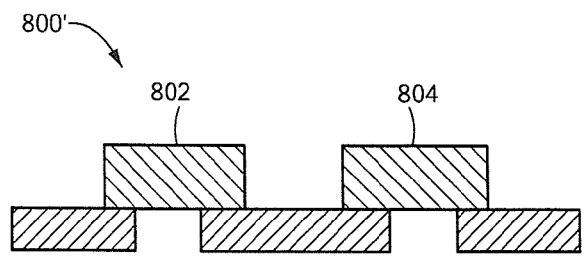
FIG. 9F is a cross-sectional view of the assembly of FIG. 9D along lines B-B.
Figure 9D:
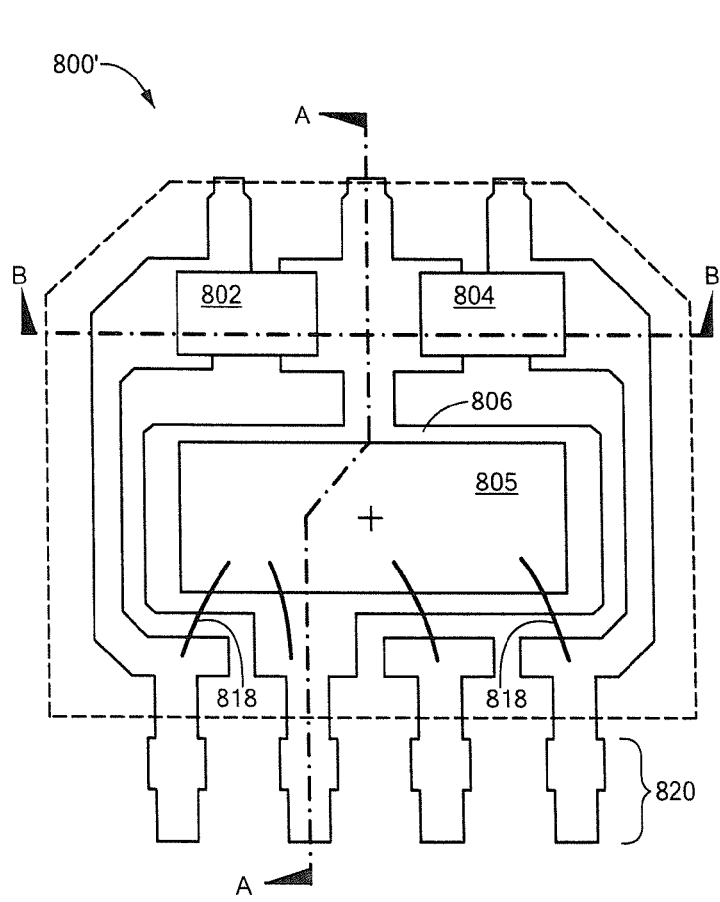
FIG. 9D is a top view of a capacitor coupled to a leadframe.
Figure 9E:
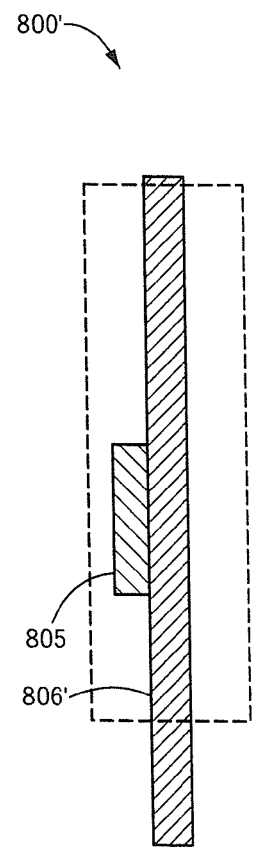
FIG. 9E is a cross-sectional view of the assembly of FIG. 9D along lines A-A.
Figure 9G:
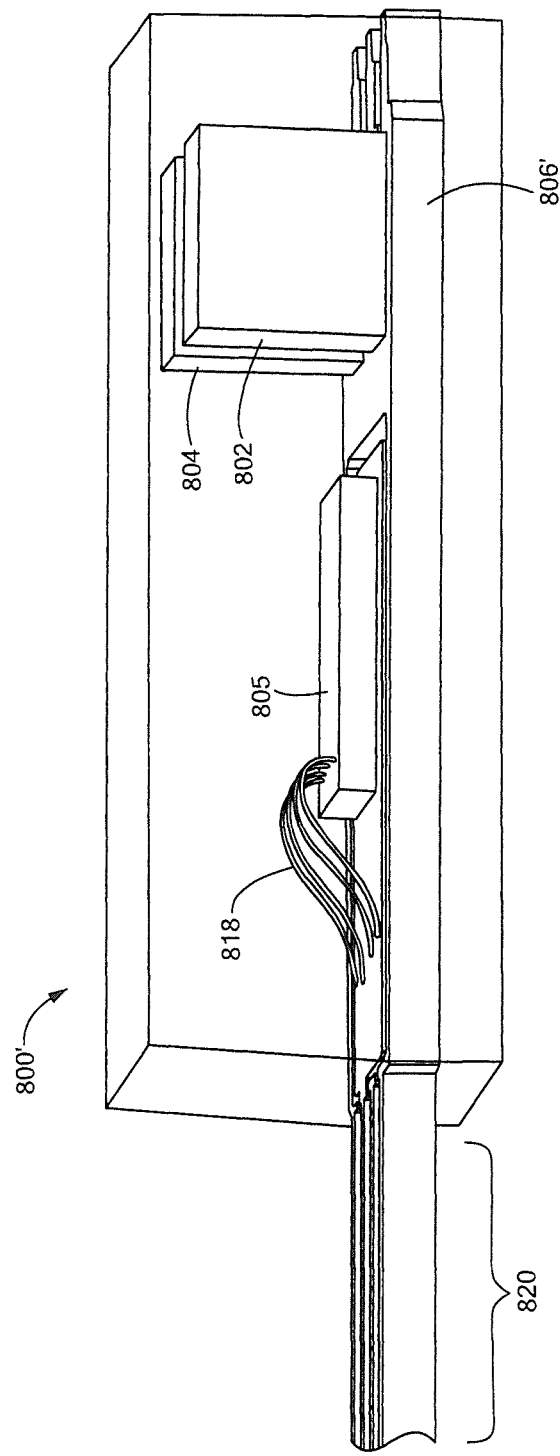
FIG. 9G is a pictorial representation of the assembly of FIG. 9D.
Figure 10C:
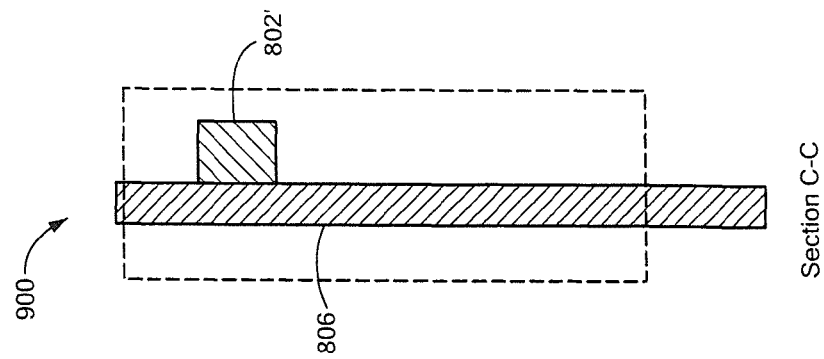
FIG. 10C is a cross-sectional view of the assembly of FIG. 10 along lines B-B.
Figure 10B:
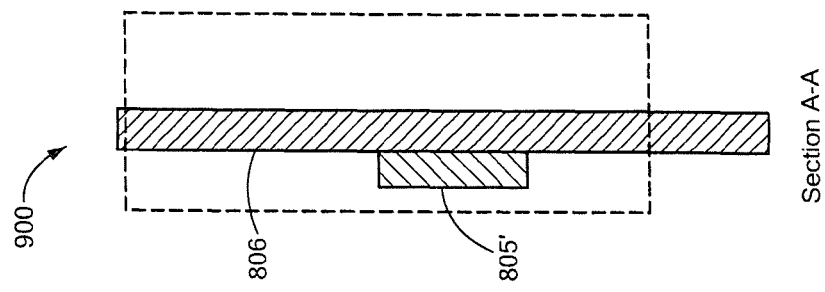
FIG. 10B is a cross sectional view of the assembly of FIG. 10 along lines A-A.
Figure 10A:
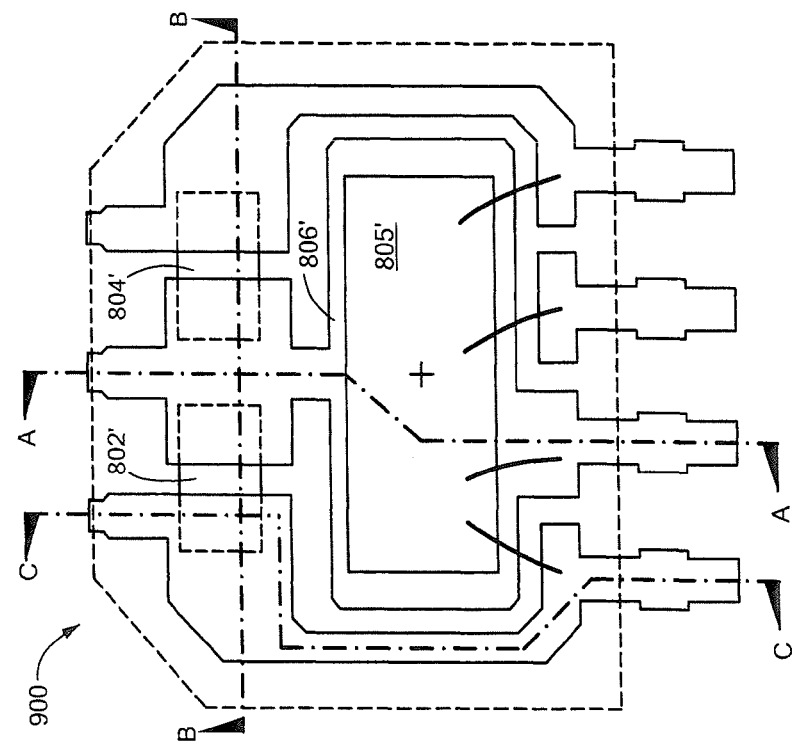
FIG. 10A is a top view of a capacitor coupled to a leadframe.

FIGS. 10A-D show another embodiment 900 having some similarity with the assembly of FIGS. 9D-F. The components are placed on an opposite side of the leadframe 806' as the die 805'. This arrangement optimizes the device for use with a magnetic sensor where a magnet is placed of the back side of the device and the leads are angled at ninety degrees (see FIG. 6) to optimize the size of the sensor.

Figure 12C:
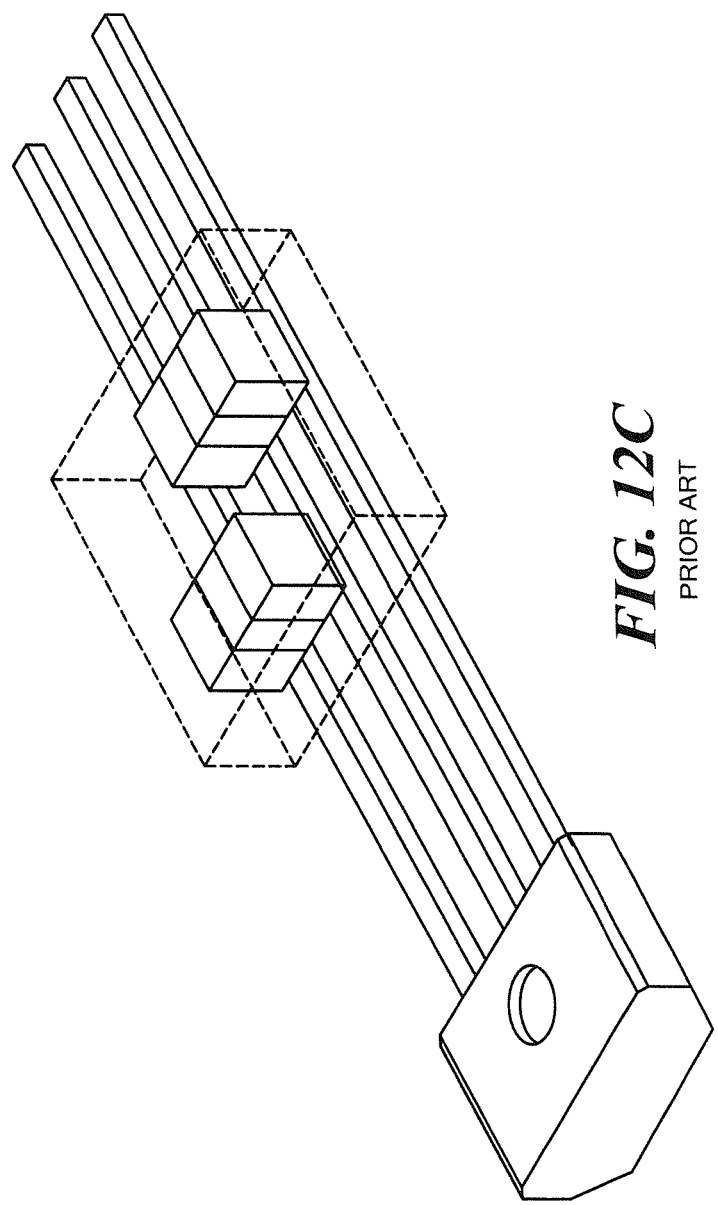
FIG. 12C is a pictorial representation of the prior art sensor of FIG. 12A.

FIGS. 11A-B show an exemplary sensor package 950 having an integrated capacitor with a body diameter that is reduced as compared with a conventional sensor without an integrated capacitor shown in FIGS. 12A-C. The leads 952 are angled ninety degrees from the leadframe within the package body 954. In one embodiment, the external leads 952 are on the opposite side of the die as the integrated capacitor, as shown in FIG. 9D. With the inventive integrated capacitor, the sensor provides a robust, noise-filtered solution in a reduced size. For example, the sensor package 950 of FIGS. 11A, B can have a diameter of about 7.6 mm, while a comparable prior art sensor shown in FIGS. 12A-C has a diameter of about 9.8 mm.

To fabricate the package 950 of FIGS. 11A-B, the leads are formed/bent by ninety degrees. The part is inserted in a pre-molded housing to align the package body and the leads. For a Hall sensor, for example, a magnet and concentrator (not shown) may be added. The assembly is then overmolded.

The exemplary invention embodiments are useful for System-in-Package (SiP) technology in a variety of applications, such as automotive applications. The inventive packaging contributes to optimizing the life cycle of passive components, improving noise reduction capability, and creating more space on circuit boards. In addition, the invention optimizes the positioning of components to reduce space requirements and enhance device sensing ability.

In another embodiment, a sensor includes on a leadframe a first die having a sensor element and a second die having circuitry and at least one integrated capacitor. While exemplary embodiments contained herein discuss the use of a Hall effect sensor, it would be apparent to one of ordinary skill in the art that other types of magnetic field sensors may also be used in place of or in combination with a Hall element. For example the device could use an anisotropic magnetoresistance (AMR) sensor and/or a Giant Magnetoresistance (GMR) sensor. In the case of GMR sensors, the GMR element is intended to cover the range of sensors comprised of multiple material stacks, for example: linear spin valves, a tunneling magnetoresistance (TMR), or a colossal magnetoresistance (CMR) sensor. In other embodiments, the sensor includes a back bias magnet. The dies can be formed independently from Silicon, GaAs, InGaAs, InGaAsP, SiGe or other suitable material.

Other embodiments of the present invention include pressure sensors, and other contactless sensor packages in general in which it is desirable to have integrated components, such as capacitors.

One skilled in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A magnetic field sensor in a molding IC package, comprising:
a die;
a magnetic field sensing element in the die;
a leadframe having opposed first and second surfaces, the leadframe supporting the die on the first surface;
lead fingers to provide electrical connections to the leadframe and to the die; a first one of the lead fingers extending from the leadframe in a single piece of material to provide an external lead of the IC package, wherein the die supporting portion of the leadframe is formed from the single piece of material; and
a component coupled to the leadframe and coupled to a first one of the lead fingers formed from the single piece of material such that the component is an integrated part of the IC package providing the sensor to minimize a an air gap between the IC package and an object of interest:
wherein the leadframe includes a downset area at which the component is coupled to the leadframe, and
wherein a thickness of the leadframe in the downset area is less than a thickness of the leadframe in a non-downset area adjacent to the downset area;

wherein the first one of the lead fingers includes the downset area to receive the component.

2. The sensor according to claim 1, further including a back bias magnet.

3. The sensor according to claim 1, wherein the component includes a capacitor.

4. The sensor according to claim 3, wherein the magnetic sensor includes one or more of a Hall element, an AMR element, and/or a GMR element.

5. The sensor according to claim 1, wherein the molded portion of the IC package has a diameter of less than or equal to 7.6 mm.

6. A method of providing a magnetic field sensor in a molding IC package, comprising:
   providing a die with a magnetic sensing element in the die;
   providing a leadframe having opposed first and second surfaces, the leadframe supporting the die on the first surface;
   providing lead fingers to provide electrical connections to the leadframe and to the die; a first one of the lead fingers extending from the leadframe in a single piece of material to provide an external lead of the IC package, wherein the die supporting portion of the leadframe is formed from the single piece of material; and
   providing a component coupled to the leadframe and coupled to a one of the lead fingers formed from the single piece of material such that the component is an integrated part of the IC package providing the sensor to minimize an air gap between the IC package and an object of interest;
   wherein the leadframe includes a downset area at which the component is coupled to the leadframe, and
   wherein a thickness of the leadframe in the downset area is less than a thickness of the leadframe in a non-downset area adjacent to the downset area;
   wherein the first one of the lead fingers includes the downset area to receive the component.

7. The method according to claim 6, further including providing a back bias magnet for the sensor.

8. The method according to claim 6, wherein the component includes a capacitor.

9. The method according to claim 6, wherein the magnetic sensor includes one or more of a Hall element, an AMR element, and/or a GMR element.

* * * * *

UNITED STATES PATENT AND TRADEMARK OFFICE
CERTIFICATE OF CORRECTION

PATENT NO. : 9,228,860 B2  
APPLICATION NO. : 13/325162  
DATED : January 5, 2016  
INVENTOR(S) : Sharma et al.

Page 1 of 1

It is certified that error appears in the above-identified patent and that said Letters Patent is hereby corrected as shown below:

Title page

Item (75) Inventors: Change "Raymond W. Engle" to -- Raymond W. Engel --.

Signed and Sealed this
Nineteenth Day of April, 2016

Michelle K. Lee  
*Director of the United States Patent and Trademark Office*

UNITED STATES PATENT AND TRADEMARK OFFICE
CERTIFICATE OF CORRECTION

PATENT NO. : 9,228,860 B2
APPLICATION NO. : 13/325162
DATED : January 5, 2016
INVENTOR(S) : Nirmal Sharma et al.

It is certified that error appears in the above-identified patent and that said Letters Patent is hereby corrected as shown below:

Specification

Column 1, line 13 delete "then placed" and replace with --then be placed--.

Column 1, line 16 delete "filtering the" and replace with --filtering and the--.

Column 1, line 30 delete "with a wire" and replace with --with wire--.

Column 2, line 48 delete "cross sectional" and replace with --cross-sectional--.

Column 3, line 31 delete "bottom 306" and replace with --bottom surface 306--.

Column 3, line 58 delete ", or set the" and replace with --, or set, the--.

Column 4, lines 23-24 delete "0.24 inch long, about 0.184 inch wide, and about 0.76 inch" and replace with --0.24 inches long, about 0.184 inches wide, and about 0.76 inches--.

Column 4, lines 24-35 delete "0.01 inch" and replace with --0.01 inches--.

Column 4, line 25 delete "0.04 inch" and replace with --0.04 inches--.

Column 5, line 6 delete "cover generally" and replace with --generally cover--.

Column 5, line 40 delete "curing etc in" and replace with --curing, etc., in--.

Column 6, line 29 delete "PCB's" and replace with --PCBs--.

Column 7, line 9 delete "Second 808a, b lead fingers" and replace with --second lead fingers 808a, b--.

Signed and Sealed this
Twenty-sixth Day of July, 2016

Michelle K. Lee
*Director of the United States Patent and Trademark Office*

Specification

Column 7, line 43 delete "818 used" and replace with --818 are used--.

Column 7, line 46 delete "820 that extend" and replace with --820 extend--.

Column 7, line 53 delete "806' as" and replace with --806' at--.

Column 7, line 55 delete "placed of" and replace with --placed on--.

Column 7, line 61 delete "leads 952" and replace with --leads--.

Column 7, line 63 delete "leads 952" and replace with --leads--.

Column 7, line 64 delete "the opposite" and replace with --an opposite--.

Column 8, line 61 delete "minimize a an" and replace with --minimize an--.